(12) United States Patent
Kameshiro et al.

(10) Patent No.: US 8,890,278 B2
(45) Date of Patent: Nov. 18, 2014

(54) SEMICONDUCTOR DEVICE

(71) Applicant: Hitachi, Ltd., Tokyo (JP)

(72) Inventors: Norifumi Kameshiro, Tokyo (JP);
Natsuki Yokoyama, Mitaka (JP)

(73) Assignee: Hitachi, Ltd., Tokyo (JP)

( * ) Notice: Subject to any disclaimer, the term of this patent is extended or adjusted under 35 U.S.C. 154(b) by 109 days.

(21) Appl. No.: 13/660,276

(22) Filed: Oct. 25, 2012

(65) Prior Publication Data
US 2013/0105819 A1    May 2, 2013

(30) Foreign Application Priority Data
Oct. 28, 2011    (JP) .................. 2011-237218

(51) Int. Cl.
*H01L 29/47*    (2006.01)

(52) U.S. Cl.
USPC ........................................ 257/471

(58) Field of Classification Search
USPC ............................... 257/471–486
See application file for complete search history.

(56) References Cited

U.S. PATENT DOCUMENTS

| | | | |
|---|---|---|---|
| 7,508,045 B2 | 3/2009 | Nishio et al. | |
| 2006/0255423 A1* | 11/2006 | Ryu et al. | 257/485 |
| 2009/0179297 A1 | 7/2009 | Stewart et al. | |
| 2009/0209090 A1* | 8/2009 | Yokoyama et al. | 438/476 |
| 2009/0224354 A1 | 9/2009 | Konstantinov et al. | |

FOREIGN PATENT DOCUMENTS

JP    2003-188391 A    7/2003

* cited by examiner

*Primary Examiner* — Karen Kusumakar
(74) *Attorney, Agent, or Firm* — Miles & Stockbridge P.C.

(57) ABSTRACT

Reliability of a semiconductor device is improved by suppressing reverse voltage deterioration at the time of reverse bias junction barrier Schottky diode using a substrate containing SiC. In a JBS diode having an active area of 0.1 $cm^2$ or more, an area of a Schottky interface at which a drift layer and a Schottky electrode are contacted can be sufficiently reduced by relatively increasing a ratio of p-type semiconductor region being a junction barrier region in an active region, and thereby deterioration in reverse voltage caused by defects existing in the drift layer is prevented.

10 Claims, 11 Drawing Sheets

SEMICONDUCTOR DEVICE

CLAIM OF PRIORITY

The present application claims priority from Japanese patent applications JP 2011-237218 filed on Oct. 28, 2011, and JP 2012-213405 filed on Sep. 27, 2012, the contents of which are hereby incorporated by reference into this application.

FIELD OF THE INVENTION

The present invention relates to a semiconductor device, and in particular, relates to a technology effective for applying to a junction barrier Schottky diode using silicon carbide.

BACKGROUND OF THE INVENTION

Compared with silicon (Si), silicon carbide (SiC) has characteristics in which a band gap is larger and a dielectric breakdown electric field is higher in an order of magnitude. Therefore, silicon carbide is expected as a material used for a power device. Particularly, a Schottky diode of a unipolar type rectifying device which is operated only by majority carriers is an effective technology for reducing loss of a power module because electric current in the reverse direction (recovery current) at the time of switching operation is not flown due to device constitution.

The Schottky diode obtains rectification by using a Schottky barrier which is generated by difference between a work function of a metal and electron affinity of a semiconductor. Leakage current in the reverse direction can be reduced by using a metal material having a high Schottky barrier height at a Schottky junction part. In this case, however, built-in potential at the time of forward bias becomes higher. The built-in potential at the time of the forward bias can be reduced by using a metal material having a low Schottky barrier height at the Schottky junction part. In this case, however, the leakage current in the reverse direction becomes higher.

With respect to the Schottky diode described above, a structure referred to as a junction barrier Schottky diode (hereinafter, referred to as a "JBS diode") in which a plurality of junction barriers are provided at the Schottky interface is proposed as a structure for suppressing the leakage current in the reverse direction by reducing an electric field applied to an interface between a metal film and a semiconductor film (hereinafter, referred to as a "Schottky interface") at the time of application of voltage in the reverse direction. The JBS diode can reduce the electric field at the Schottky interface because a depletion layer extends from the junction barrier part at the time of application of voltage in the reverse direction.

As a structure for suppressing resistance increase at the time of an operation in the forward direction in the JBS diode, a structure increasing an impurity concentration in a region surrounded by the junction barrier is disclosed in Japanese Unexamined Patent Application Publication No. 2003-188391.

SUMMARY OF THE INVENTION

However, even when the electric field at the Schottky interface is tried to be reduced by forming the junction barrier part as described above or resistance increase at the time of the operation in the forward direction is tried to be prevented, characteristics of the Schottky diode may deteriorate, if an ideal Schottky interface cannot be formed. Characteristics in the reverse direction of the Schottky diode is very easy to be affected by a state of the Schottky interface. When foreign particles or defects exist close to the Schottky interface, the leakage current in the reverse direction increases. As a result, desired rectification cannot be obtained. Form these factors, the Schottky diode has a lower yield rate compared with a PN junction type diode (a PN diode).

This is because the Schottky diode in which a metal film is formed on the surface of a drift layer is easy to be affected by the drift layer, defects generated during a process for manufacturing, or foreign particles-compared with the PN diode in which junction barrier is formed inside of a drift layer on a substrate by epitaxial growth or ion implantation. The defects generated during the process for manufacturing or the foreign particles can be controlled and reduced in the process for manufacturing. However, defects included in the drift layer are determined by quality of used substrate or epitaxial growth conditions of the drift layer and the like. Consequently, removal of the defects in the drift layer by devising the process for manufacturing may be difficult. Characteristics of the Schottky diode in the reverse direction are deteriorated due to the defect of the surface of the drift layer, and as a result, a problem of malfunction of the semiconductor device arises.

Particularly, when a Schottky diode using an SiC substrate having high reverse voltage is formed, a semiconductor chip having an active region having more than a certain level of area is required to be formed in order to realize practicable device current. However, when the area of the Schottky interface becomes large due to extension of the area of the active region, deterioration of the characteristics in the reverse direction caused by the defect described above becomes significant.

Therefore, it becomes important to prevent deterioration in reliability of the semiconductor devices when semiconductor devices including the Schottky diode using SiC are manufactured in a high yield rate.

A purpose of the present invention is to improve the reliability of the semiconductor device.

The purpose and novel characteristics of the present invention described above will be clarified by description of the specification and the accompanying drawings.

In the inventions disclosed in the present application, the scope of a representable invention is simply described as follows.

A semiconductor device of one invention of the present application including a Schottky barrier diode; the Schottky barrier diode includes: a semiconductor substrate having a first conduction type and containing silicon carbide; a first semiconductor region formed on the semiconductor substrate and having the first conduction type; an active region having an area of 0.1 cm$^2$ or more in the main surface of the first semiconductor region; a plurality of second semiconductor regions formed on the upper surface of the first semiconductor region in the active region and having a second conduction type opposite to the first conduction type; a first electrode connected by Schottky connection to the first semiconductor region in the active region; and a second electrode electrically connected to a back surface of the semiconductor substrate; wherein a multiplication of a density of defects $D_{EP}$ which the first semiconductor region has and an area of the first, semiconductor region $A_S$ exposed from the second semiconductor regions in the active region satisfies $D_{EP} \times A_S \leq 223$.

According to the present invention, the reliability of the semiconductor device can be improved.

DETAILED DESCRIPTION OF THE PREFERRED EMBODIMENT

Hereinafter, embodiments of the present invention will be described in detail based on the drawings. Here, for all the drawings for describing the embodiments, the same reference signs are assigned to member having the same function, and repeated description of the members is omitted. In the following embodiments, in principle, description of the same or a similar part is not repeated except that description is particularly required.

Embodiment 1

Figure 1:
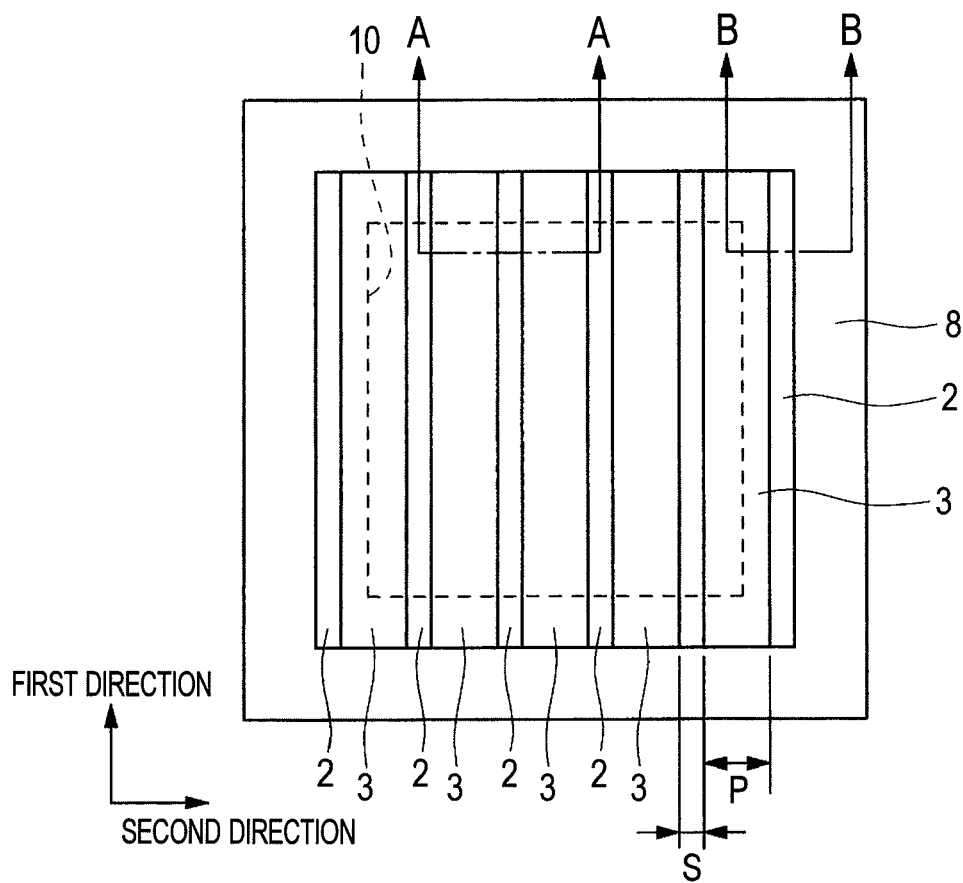
FIG. 1 is a plain view illustrating a semiconductor device being an embodiment 1 of the present invention.
Figure 2:
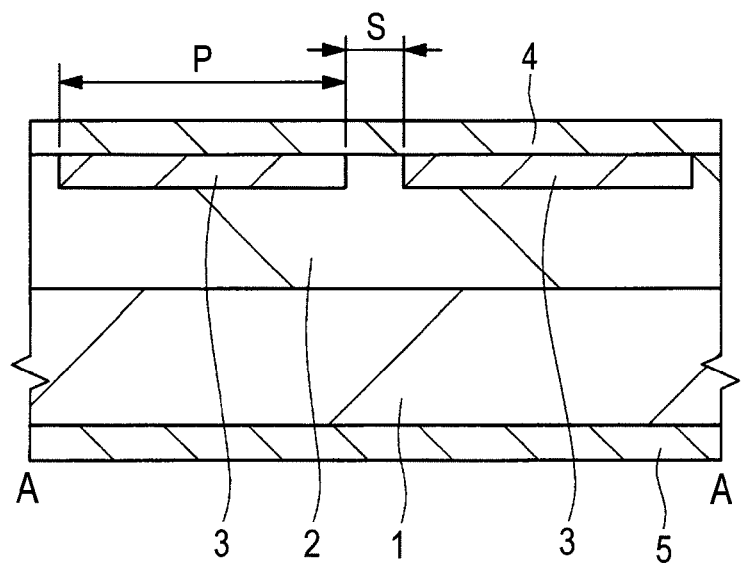
FIG. 2 is a cross-sectional view taken from line A-A of FIG. 1.
Figure 3:
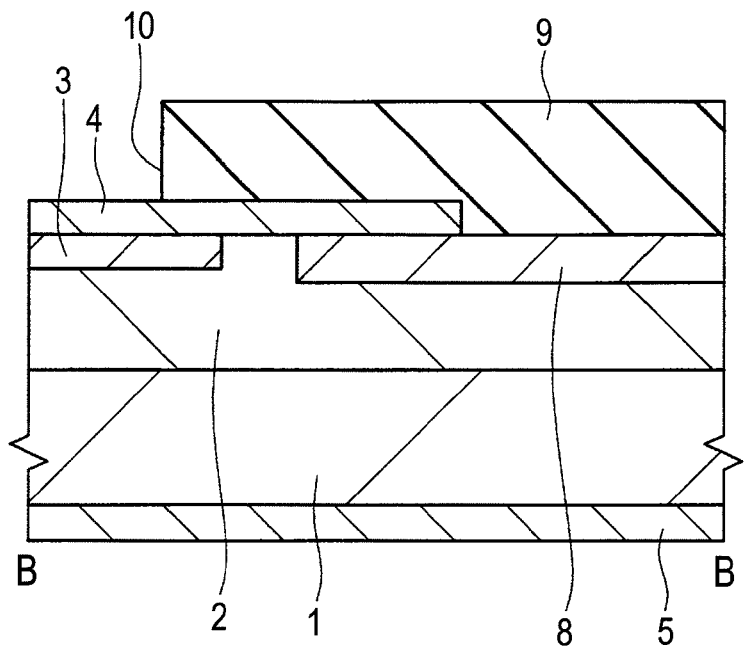
FIG. 3 is a cross-sectional view taken from line B-B of FIG. 1.

A plain view of a semiconductor device of this embodiment is illustrated in FIG. 1, and cross-sectional views taken from line A-A and line B-B are illustrated in FIG. 2 and FIG. 3, respectively. The plain view of FIG. 1 is a view for illustrating a positional relationship of main parts of the semiconductor device, and positional relationship and dimensions of the structure in planar view is not precisely illustrated. In order to facilitate to see the view, a part of layers such as an electrode on a drift layer 2 and an interlayer insulating film is not illustrated in FIG. 1. FIG. 1, as a structure of a JBS diode having an SiC substrate, a stripe pattern in which a p-type semiconductor region (a junction barrier region) 3 extending in a first direction along the main surface of the semiconductor substrate are plurally arranged side by side in a constant space in a second direction perpendicular to the first direction and along the main surface of the semiconductor substrate are illustrated. FIG. 1 mainly illustrates a semiconductor region formed on the upper surface of the drift layer 2 formed on the semiconductor substrate.

As illustrated in FIG. 1, the p-type semiconductor regions 3 which are arranged side by side in the stripe shape are plurally formed on the upper surface of the drift layer 2. An annular p-type semiconductor region (a guard ring region) 8 is formed in such a manner that the guard ring region 8 surrounds the region where the p-type semiconductor regions 3 are formed side by side. The guard ring region 8 is an annular semiconductor region defining an active region. In the active region, the p-type semiconductor regions 3 are arrange side by side in the stripe shape. Therefore, the upper surface of the drift layer 2 exposing from a space between the p-type semiconductor regions 3 adjacent each other in the second direction also has the stripe pattern in planar view.

FIG. 2 is a cross-sectional view taken from line A-A of FIG. 1. FIG. 2 illustrates a part of a cross sectional structure of the active region where electric current is flown at the time of power distribution of the semiconductor device in this embodiment. The term "the active region" here means a region where electric current is flown at the time of power distribution of a semiconductor element.

The semiconductor device of this embodiment has an $n^+$-type semiconductor substrate 1 mainly containing SiC (silicon carbide) in which a first conduction type (n type) impurity (for example, N (nitrogen)) is introduced in high concentration, and the $n^-$-type drift layer 2 formed on the semiconductor substrate 1. The drift layer 2 is a semiconductor region mainly containing SiC in which the first conduction type (n type) impurity (for example, N (nitrogen)) is introduced in low concentration compared with the semiconductor substrate 1, and a p-type semiconductor region 3 in which a second type conduction type (p type) impurity (for example, Al (aluminum)) being different from the first conduction type impurity is introduced is formed on upper surface of the drift layer 2.

On the drift layer 2, a Schottky electrode 4 is formed in contact with the upper surface of the drift layer 2 and the upper surface of the p-type semiconductor region 3. On the lower part of the semiconductor substrate 1, an ohmic electrode 5 is formed in contact with a back surface of the semiconductor substrate 1. The semiconductor device of this embodiment is a JBS diode including the semiconductor substrate 1, the drift layer 2, the p-type semiconductor region (the junction barrier region) 3, the Schottky electrode 4, and the ohmic electrode 5. The Schottky electrode 4 is an anode electrode and the ohmic electrode 5 is a cathode electrode. The Schottky electrode 4 is connected by Schottky connection to the upper surface of the drift layer 2 and the ohmic electrode 5 is ohmically connected the back surface of the semiconductor substrate 1. Here, the upper surface of the p-type semiconductor region 3 and the Schottky electrode 4 can be connected by Schottky connection or connected by ohmic connection.

Characteristics of the JBS diode of this embodiment is that the p-type semiconductor region (the junction barrier region)

3 has a large proportion in the active region of the upper surface of the drift layer 2, and has small area of the Schottky interface which is a junction surface of the upper surface of the drift layer 2 and the Schottky electrode 4. A width S illustrated in FIG. 1 and FIG. 2 represents a space in the second direction between the multiple p-type semiconductor regions 3 extending to the first direction plurally arranged side by side each other in the second direction in the upper surface of the drift layer 2 and a width P represents a width in the second direction of the p-type semiconductor region 3.

FIG. 3, a cross-sectional view taken from line B-B of FIG. 1 is illustrated. FIG. 3 is the cross-sectional view including the guard ring region 8 formed closes to the edge of the active region of the JBS diode of this embodiment. illustrated in FIG. 3, the p-type semiconductor region 3 and the guard ring region 8 containing a p-type impurity (for example, Al (aluminum)) formed so as to surround the p-type semiconductor region 3 in planar view are formed on the upper surface of the drift layer 2 on the semiconductor substrate 1. The Schottky electrode 4 illustrated in FIG. 2 is terminated just above the guard ring region 8 illustrated in FIG. 3. An interlayer insulating film 9 is formed so as to cover the edge of the Schottky electrode 4 and the upper surface of the guard ring region 8 exposed from the Schottky electrode 4. The interlayer insulating film 9 is formed so as to surround the active region in planar view, and, an opening part 10 exposing the Schottky electrode 4 connected to the upper surface of the drift layer 2 and the upper surface of the p-type semiconductor region 3 is formed in the center the interlayer insulating film. Here, a region surrounded by the annular guard ring region 8 illustrated in FIG. 1 is the active region.

In the plain view of FIG. 1, illustrations of the Schottky electrode 4 (refer to FIG. 2) and the interlayer insulating film (refer to FIG. 3) formed over the active region on the drift layer 2 are omitted. However, a position of the rectangular opening part 10 of the interlayer insulating film 9 is illustrated by a dashed line. In other words, the interlayer insulating film 9 is not formed inside of the opening part 10 illustrated by the dashed line in FIG. 1, and the interlayer insulating film 9 (not illustrated) is formed outside of the opening part 10 illustrated by the dashed line.

Figure 7:
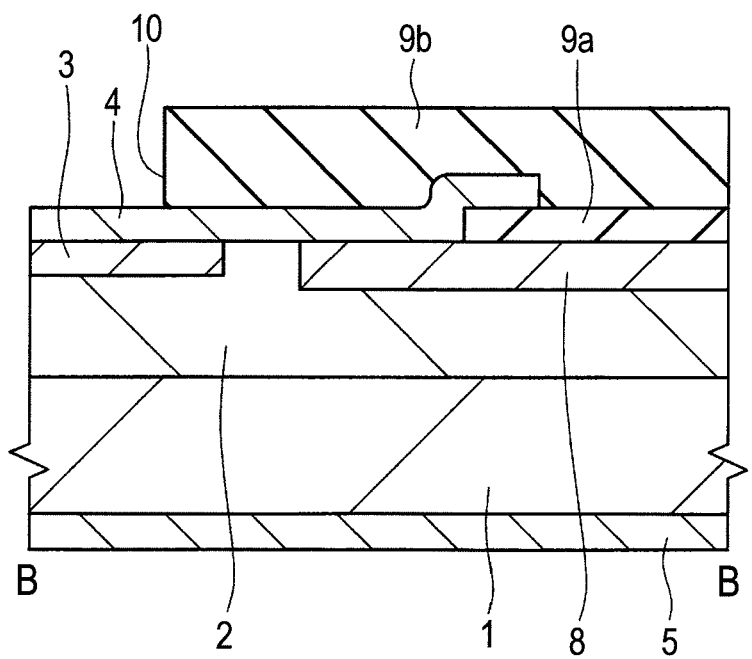
FIG. 7 is a cross-sectional view of a modified example of the semiconductor device of the embodiment 1 of the present invention.

The structure of the edge of the active region, that is, the structure of the cross sectional surface taken from B-B line of FIG. 1 is not limited to the structure illustrated in FIG. 3, and a structure, for example, illustrated in FIG. 7 may be applicable. FIG. 7 is a cross-sectional view of a modified example of the semiconductor device of this embodiment. The structure of the modified example illustrated in FIG. 7 resembles the structure illustrated in FIG. 3. However, while the Schottky electrode 4 is formed along the main surface of the semiconductor substrate 1 in a planar shape in FIG. 3, the Schottky electrode 4 illustrated in FIG. 7 is mounted on the upper part of an interlayer insulating film 9a, which is formed on the guard ring region 8 so as to surround the active region, and is continuously formed from the upper part of the active region. An interlayer insulating film 9b is formed so as to cover the surface of the interlayer insulating film 9a exposed from the Schottky electrode 4 and the edge part of the Schottky electrode 4.

In the modified example illustrated in FIG. 7, the interlayer insulating film 9a is not connected to the active region, that is, the upper surface of the drift layer 2 exposed from the guard ring region 8 and the upper surface of the p-type semiconductor region 3, and terminates just above the guard ring region 8. Different from the cross-sectional view illustrated in FIG. 3, the interlayer insulating film 9 is not formed in the modified example. The interlayer insulating films 9a, 9b are formed instead of the interlayer insulating film 9. The interlayer insulating film 9b is formed so as to cover an edge part of the Schottky electrode 4 which is mounted on the interlayer insulating film 9a, and has the opening part 10 exposing the active region as similar to the interlayer insulating film 9.

Operation of the JBS diode will be described using FIG. 2. When voltage in the forward direction is applied to the JBS diode by applying positive voltage to the Schottky electrode 4, electric current flows from a side of the Schottky electrode 4 being the anode electrode to a side of the ohmic electrode 5 being the cathode electrode through the drift layer 2 being the n-type semiconductor region, because the Schottky barrier at the Schottky junction surface in the interface between the drift layer 2 and the Schottky electrode 4 becomes low. Contrary, when voltage in the reverse direction is applied, the Schottky barrier at the Schottky junction surface in the interface between the drift layer 2 and the Schottky electrode 4 becomes high. As a result, electric current is not flown in the JBS diode due to expansion of the depletion layer. By using such characteristics, the JBS diode is used as an element having rectification.

The JBS diode of this embodiment illustrated in FIG. 1 has a higher yield rate in characteristics in, the reverse direction compared with the Schottky barrier diode even when the upper surface of the drift layer 2 has many defects, because a ratio of the p-type semiconductor region 3 is large and area of the Schottky interface is small in the active region. Hereinafter, the reason why the semiconductor device of this embodiment can obtain the effect described above is described using a comparative example and the like.

Figure 17:
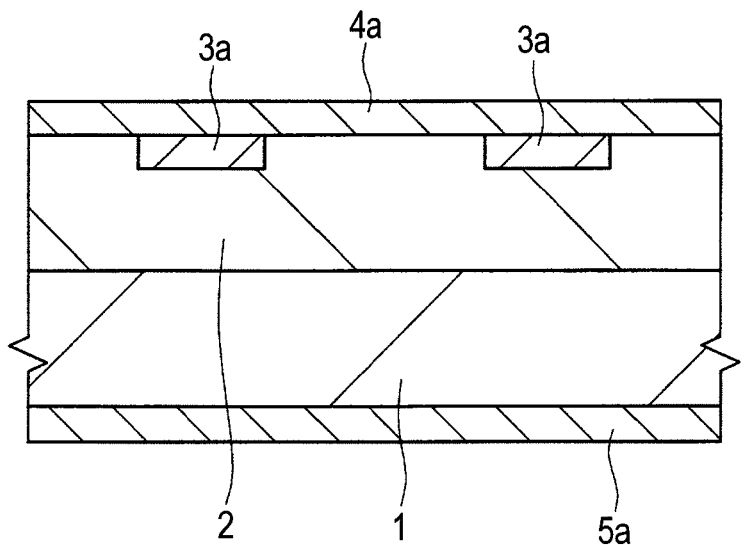
FIG. 17 is a cross-sectional view of a semiconductor device illustrated as a comparative example.

First, a cross-sectional view of a JBS diode constituting a semiconductor device of the comparative example is illustrated in FIG. 17. As illustrated in FIG. 17, the JBS diode of the comparative example includes an $n^+$-type semiconductor substrate 1 mainly containing silicon carbide (SiC), an $n^-$-type drift layer 2 formed on the semiconductor substrate 1, a p-type semiconductor region 3 formed on the upper surface of the drift layer 2, a Schottky electrode 4a formed on the drift layer 2 in contact with the upper surface of the drift layer 2, and an ohmic electrode 5a formed on the back surface of the semiconductor substrate 1. Compared with the semiconductor device of this embodiment illustrated in FIG. 1, the semiconductor device of the comparative example illustrated in FIG. 17 has a smaller area of upper surface of the p-type semiconductor region 3 and a larger area of the upper surface of the drift layer 2 exposed from the p-type semiconductor region 3 in the active region. Although the JBS diode can reduce leakage current in the reverse direction, the JBS diode has a property in which resistance at the time of the operation in the forward direction becomes high due to small area of the Schottky diode region operated in low voltage at the time of the operation in the forward direction. As measures against this property, the JBS diode being the semiconductor device of the comparative example as illustrated in FIG. 18 may be used.

Figure 18:
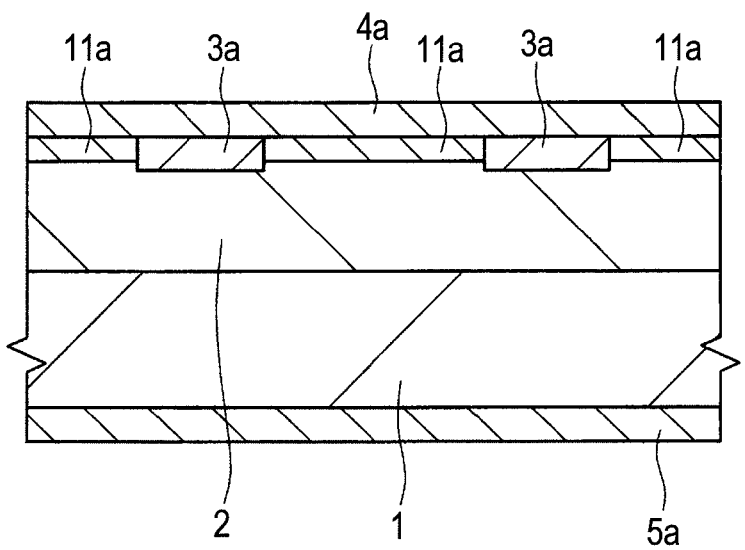
FIG. 18 is a cross-sectional view of a semiconductor device illustrated as a comparative example.

Difference between the JBS diode illustrated in FIG. 17 and the JBS diode illustrated in FIG. 18 is in that an n-type semiconductor region 11a having a higher impurity concentration than that of the drift layer 2 is located on the upper surface of the drift layer 2. By this structure, resistance close to a junction barrier formation region, that is, the Schottky interface can be reduced.

However, even when the semiconductor device of the comparative example of FIG. 18 is used, defects which the semiconductor substrate originally has exists in the substrate of the JBS diode using silicon carbide, and due to the defects, defects F are formed inside of the drift layer and in the upper surface of the drift layer at the time of formation of the drift layer by the epitaxial growth method. As a result, characteristics of the JBS diode in the reverse direction may be deteriorated due to the defects of the upper surface of the drift layer. This is because the characteristics of the Schottky diode in the reverse direction is easy to be affected by a status of the Schottky interface and leakage current in the reverse direction is rapidly increases if foreign particles or defects exist close to the Schottky interface, and as a result, reverse voltage at the time of reverse bias is decreased and desired rectification cannot be obtained. An occurrence rate of such reverse voltage failure becomes remarkable as the area of the Schottky interface between the drift layer having defects and the Schottky electrode becomes larger. Therefore, the yield rate of the JBS diode, which is easily affected by defects due to large area of the Schottky interface in the active region as illustrated in FIG. 17 and FIG. 18, is deteriorated, and as a result, reliability of the semiconductor devices including the JBS diode is deteriorated.

If distribution of the defects is random, a yield rate Y (%) is determined by Poisson distribution, and represented by the following formula. The yield rate Y indicates probability that semiconductor chips having no abnormality of the characteristics in the reverse direction can be produced.

$$Y = \exp(-D_K \times A_S) \quad (1)$$

In formula 1, $D_K$ is a density of killer defects (killer defect density) which cause the abnormality of the characteristics in the reverse direction, and $A_S$ is an area of the Schottky interface. The killer defect density $D_K$ indicates the number of the killer defects per unit area of the surface of the object.

Figure 16:
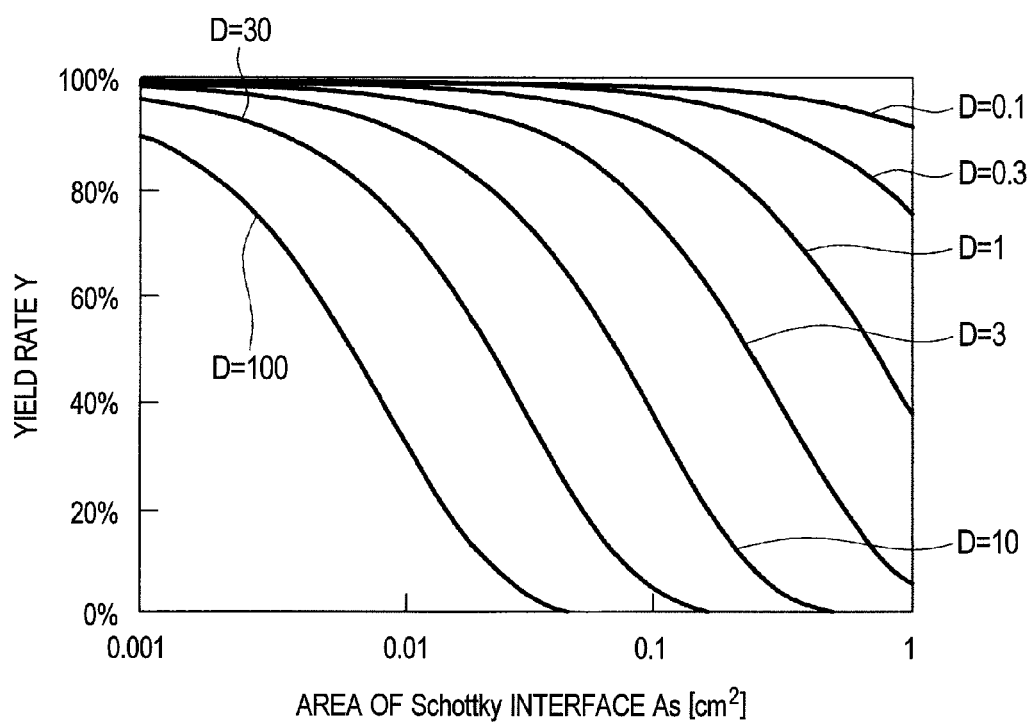
FIG. 16 is a graph illustrating an area dependence of the Schottky interface on a yield rate of the Schottky diode.

In FIG. 16, a graph in which relation of the yield rate Y and the area of the Schottky interface $A_S$ to the defect density D of the surface of the drift layer is plotted. Briefly, the FIG. 16 is the graph illustrating dependence of the area of the Schottky interface on a yield rate in relation to the characteristics of the Schottky diode in the reverse direction. The area of the Schottky interface $A_S$ indicates an area of the Schottky interface at which the drift layer 2 and the Schottky electrode 4 are connected in the active region which is formed in 0.1 cm² or more in the upper surface of the drift layer 2 illustrated in FIG. 1. The defect density D indicates the number of defects per unit area in the surface of the object. Briefly, the area $A_S$ is an area of a region where the p-type semiconductor region 3 being the junction barrier region in the active region. Namely, a value of the area $A_S$ is a value calculated by subtracting the area of the upper surface of the p-type semiconductor region 3 from the area of the active region is no formed. In other words, the area $A_S$ is an area of the upper surface of the drift layer 2 exposed from the p-type semiconductor region 3 in the active region.

In the graph of FIG. 16, the vertical axis represents a yield rate of the Schottky diode and the horizontal axis represents an area of the Schottky interface. In FIG. 16, multiple graphs are illustrated depending on largeness of the defect density being the number of the defects per 1 cm². Briefly, in FIG. 16, each graph of D=100 counts/cm², D=30 counts/cm², D=10 counts/cm², D=3 counts/cm², D=1 count/cm², D==0.3 counts/cm², and D=0.1 counts/cm² is illustrated.

As illustrated in FIG. 16, for example, when the area of the Schottky interface $A_S$ is 0.1 cm², it is found that the yield rate Y is about 90% in the case of D=1 count/cm², while Y is decreased to 40% or less in the case of D=10 counts/cm². Form this result, it is found that a Schottky diode having a high yield rate can be manufactured by selecting an element dimension of small area depending on a substrate defect density.

However, a semiconductor chip having a large area may be required for some applications. In other words, for example, in the case of a JBS diode having a reverse voltage of 3.3 kV or more, a current density of the active region at the time of power distribution is 100 A/cm² or less form the viewpoint of element resistance. Therefore, an active area of 0.1 cm² or more is required in order to obtain an element current of 10 A or more as an entire semiconductor chip. For such a JBS diode, a semiconductor chip having an element current of less than 10 A is not practical.

In other words, as means for preventing deterioration of the characteristics in the reverse direction of the JBS diode and preventing deterioration of the yield rate, it is conceivable that the JBS diode having a small area of the active region corresponding to the defect density of the substrate is formed. However, such a JBS diode cannot obtain sufficient element current from the viewpoint of practicability.

In other words, a practical semiconductor chip of JBS diode requires an active area of 0.1 cm² or more. However, when the active region is expanded to 0.1 m² or more, a yield rate decreases by decrease in reverse voltage of the JBS diode the time of reverse bias caused by defects which the semiconductor substrate constituting the JBS diode has. Thereby, reliability of the semiconductor device including the JBS diode is deteriorated.

Figure 9:
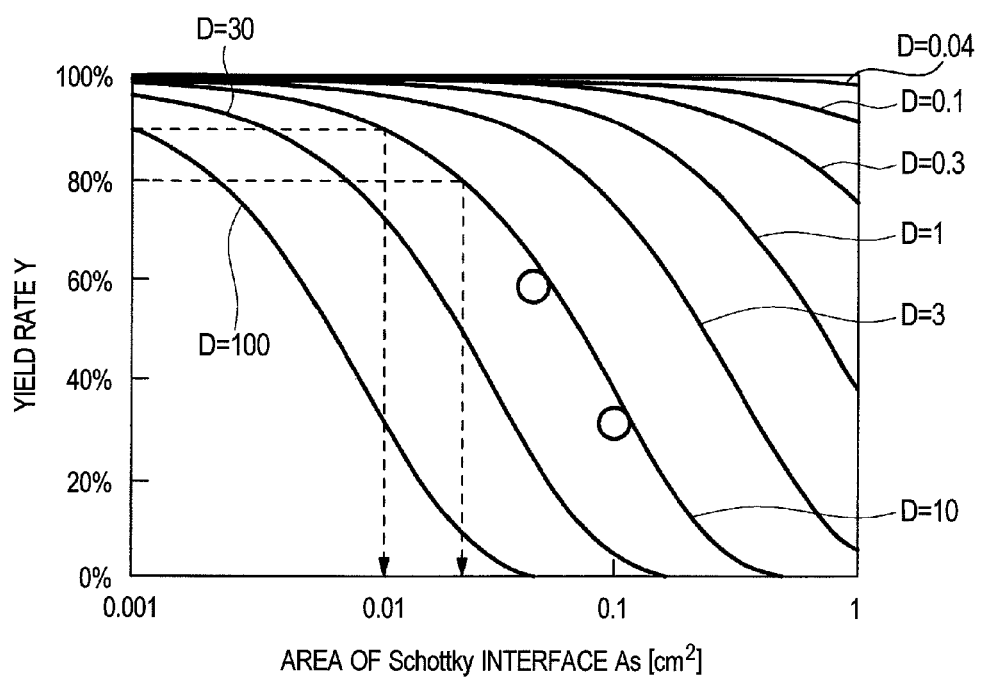
FIG. 9 is a graph illustrating area dependence of the Schottky interface on a yield rate of a Schottky diode.

Here, a graph of the experimental result which the inventors of the present invention have performed is illustrated in FIG. 9. FIG. 9 is the graph illustrating dependence of the area of the Schottky interface on a yield rate of the characteristics in the reverse direction of the Schottky diode formed by using a semiconductor substrate including SiC. In the graph of FIG. 9, the vertical axis represents the yield rate of the Schottky diode and the horizontal axis represents the area of the Schottky interface. In FIG. 9, multiple graphs are illustrated depending on size of the defect density being the number of the defects per 1 cm². Briefly, in FIG. 9, each graph of D=100 counts/cm², D=30 counts/cm², D=10 counts/cm², D=3 counts/cm², D=1 count/cm², D=0.3 counts/cm², and D=0.1 counts/cm² is illustrated.

Here, the JBS diode is formed by using a specific semiconductor substrate, and two points are plotted in FIG. 9 as white circles from the values of the yield rates corresponding to the Schottky area. Thereby, it is found that about 10 counts/cm² of a killer defect density $D_K$ which cause abnormality of the characteristics of the Schottky diode in the reverse direction in the drift layer on the upper surface of the semiconductor substrate used exists.

When formula 1 is transformed, the defect density and the area can be represented by formula 2.

$$D_K \times A_S = -\ln(Y) \quad (2)$$

Consequently, as illustrated by an arrow of the dashed line in FIG. 9, following formula 3 should be satisfied in order to satisfy a yield rate of 80% or more.

$$D_K \times A_S \le 0.223 \quad (3)$$

Similarly, as illustrated by an arrow of the dashed line in FIG. 9, following formula 4 must be satisfied in order to satisfy a yield rate of 90% or more.

$$D_K \times A_S \le 0.105 \quad (4)$$

From the viewpoint of practical use of the JBS diode using the SiC substrate, formula 3 should be satisfied because the yield rate of 80% or more is essential. As illustrated in FIG. 9, a Schottky diode can be obtained in a yield rate of 80% or more when following formula 5 is satisfied, and a Schottky diode can be obtained in a yield rate of 90% or more when following formula 6 is satisfied on a drift layer on the semiconductor substrate, because a killer defect density of a semiconductor substrate used in the experiment is about 10 counts/cm².

$$A_S \leq 0.0223 \quad (5)$$

$$As \leq 0.0105 \quad (6)$$

Here, as the semiconductor device of this embodiment illustrated in FIG. 1 and FIG. 2, formula 5 can be satisfied in a JBS diode having an area of the active region of 0.1 cm², when the JBS diode is formed in a stripe pattern in which a ratio, of a width P of the p-type semiconductor region 3 in the second direction to a width S of the drift layer 2 in the Schottky, interface in the second direction is set to about P:S=4:1. Briefly, formula 5 is satisfied when a JBS structure is formed in a stripe pattern having a width P=12 μm and a width S=3 μm.

Similarly, formula 6 is satisfied when a JBS structure is formed in a stripe pattern having a ratio of about P:S=9:1. Briefly, formula 5 is satisfied when a stripe pattern having a width P=9 μm and a width S=1 μm is formed.

However, in an actual drift layer, the higher number of dislocation defects or stacking faults may be included compared with the number of defects described above. A method for detecting these defects may include a method for forming an etch pit by a molten KOH (potassium hydroxide) method. The term "etch pit" here means abnormal etching such as pits formed by unequal etching of the surface of an etching object caused by crystal defects and the like existing in the etching object when the semiconductor substrate and the like are etched.

A density of the etch-pit (an etch pit density $D_{EP}$) formed by the molten KOH-method is about 10000-30000 counts/cm². Consequently, it is conceivable that not all defects cause the abnormality of the Schottky diode in the reverse direction, but the abnormality in the reverse direction is caused when a plurality of dislocation defects which cause leakage in the reverse direction exist. The term "etch pit density ($D_{EP}$)" here means the number of defects existing per unit area of the surface of the object. As described above, this defect is the pit and the like formed in the surface of the etching object after the etching process caused by the crystal defects existing in the etching object.

Form this result, as shown in following formula 7, existence of 1000 counts to 3000 counts of the etch pit can be converted to existence of one count of the killer defect.

$$D_K = D_{EP}/1000 \text{ to } D_{EP}/3000 \quad (7)$$

Consequently, formula 3 and formula 4 can be transformed to formula 8 and formula 9 as follows, respectively.

$$D_{EP} \times A_S \leq 223 \quad (8)$$

$$D_{EP} \times A_S \leq 105 \quad (9)$$

Figure 10:
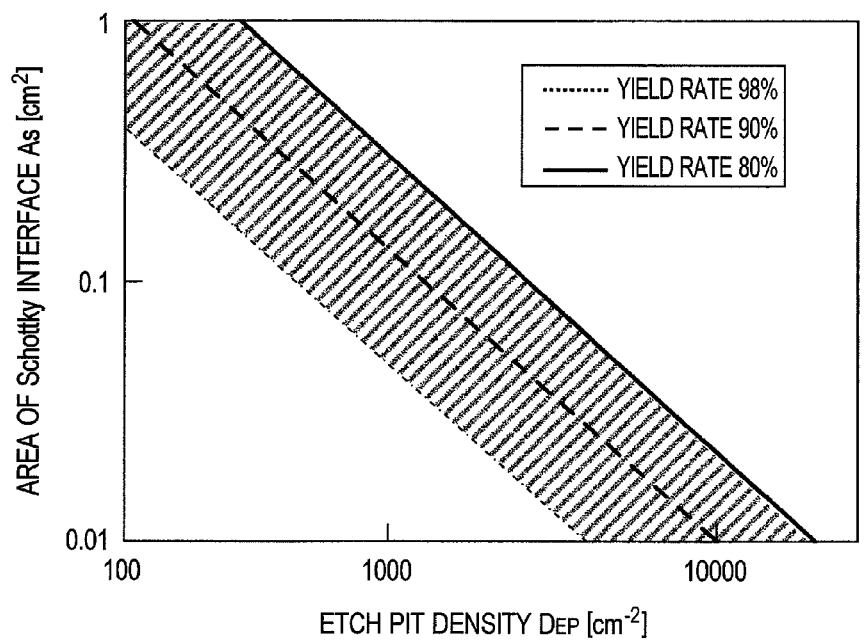
FIG. 10 is a graph illustrating a relation between an etch pit density and the Schottky interface area.

In other words, a yield rate of 80% or more can be obtained by forming a JBS structure having $D_{EP} \times A_S$ of 223 or less, and yield rate of 90% or more can be obtained by forming a JBS structure having $D_{EP} \times A_S$ of 105 or less. This relationship is illustrated in FIG. 10. The graph of FIG. 10 is a graph illustrating a relationship between the etch pit density in the horizontal axis and the area of the Schottky interface in the vertical axis. In FIG. 10, the graph in the case of the yield rate of 80% is illustrated by a solid line and the graph in the case of the yield rate of 90% is illustrated by a dashed line.

For example, it is assumed that a JBS diode having a current capacity of 50 A for high reverse voltage application which includes, a drift layer 2 having an impurity concentration of about $3 \times 10^{15}$ cm⁻³ and a thickness of 30 μm, and used in a current density $D_{EP}$ of 100 A/cm² is formed in a yield rate of 80% or more. In this case, when a substrate has an etch pit density $D_{EP}$ of 10000 cm⁻² a JBS structure is formed in such a manner that an area of the active region is 0.5 cm² and the area of the Schottky interface $A_S$ is 4.5% or less of the area of the active region. Briefly, for example, a JBS structure is formed in a stripe pattern of a width P=43 μm and a width S=2 μm.

Similarly, in the case of a substrate having an etch pit density $D_{EP}$ of 3000 cm⁻², when a JBS diode having a current capacity of 50 A is formed in a yield rate of 80% or more, the area of the Schottky interface $A_S$ is set to 14.9% or less of the area of the active region. Briefly, a JBS structure is formed in a stripe pattern having a width. P=18 μm and a width S=3 μm.

Similarly, in the case of a substrate having an etch pit density $D_{EP}$ of 1000 cm⁻², when a JBS diode having a current capacity of 50 A is formed in a yield rate of 80% or more, the area of the Schottky interface $A_S$ is set to 44.6% or less of the area of the active region. Briefly, for example, a JBS structure is formed in a stripe pattern of a width P=7 μm and a width S=3 μm. When the JBS diode is manufactured in a yield rate of 90% or more, the area of the Schottky interface $A_S$ is set to 21.1% or less of the area of the active region. Briefly, for example, a JBS structure is formed in a stripe pattern of a width P=12 μm and a width S=3 μm.

When a JBS diode having a current capacity of 100 A is manufactured in a high yield rate, a ratio of the area of the Schottky interface $A_S$ in the active region is required to be further reduced. In the case of a substrate having an etch pit density $D_{EP}$ of 3000 cm⁻², when the JBS diode is formed in a yield rate of 80% or more, the area of the Schottky interface $A_S$ is set to 7.4% or less of the area of the active region. Briefly, for example, a JBS structure is formed in a stripe pattern of a width P=38 μm and a width S=3 μm.

In the case of a substrate having an etch pit density of 1000 cm⁻², when the JBS diode is formed in a yield rate of 80% or more, the area of the Schottky interface $A_S$ is set to 22.3% or less of the area of the active region. Briefly, for example, a JBS structure is formed in, a stripe pattern of a width P=11 μm and a width S=3 μm. When the JBS diode is manufactured in a yield rate of 90% or more, the area of the Schottky interface $A_S$ is set to 10.5% or less of the area of the active region. Briefly, for example, a JBS structure is formed in a stripe pattern of a width P=26 μm and a width S=3 μm.

As described above, the semiconductor device of this embodiment provides the active region having an area of 0.1 cm² or more on the upper surface of the drift layer of the first conduction type formed on the semiconductor substrate mainly including SiC, provides the semiconductor region of the second conduction type on the main surface of the drift layer in the active region, connects the Schottky electrode formed on the drift layer to the drift layer in the form of Schottky junction, and provides the ohmic electrode on the back surface of the semiconductor substrate to form the JBS diode. Here, it is characterized in that the multiplication of the etch pit density $D_{EP}$ which the drift layer has and the region where the semiconductor region in the active region including the upper surface of the drift layer is not formed, that is, the area of the interface $A_S$ where the drift layer and the Schottky electrode are contacted satisfies $D_{EP} \times A_S \leq 223$ being formula 8 described above.

Thereby, reverse voltage and element current which are required for practical use can be obtained and a yield rate of 80% which is essential from the viewpoint of practical use of the JBS diode can be obtained, even when a JBS diode has an active region of 0.1 cm² or more for the purpose of high-current applications. Therefore, prevention of reduction in the reverse voltage and improvement of the reliability of the semiconductor device including the JBS diode can be achieved.

Figure 8A:
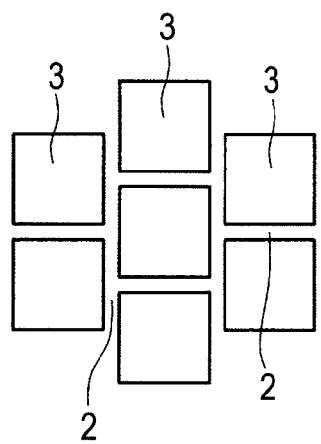
FIG. 8A is a plain layout illustrating a modified example of the semiconductor device of the embodiment 1 of the present invention.
Figure 8B:
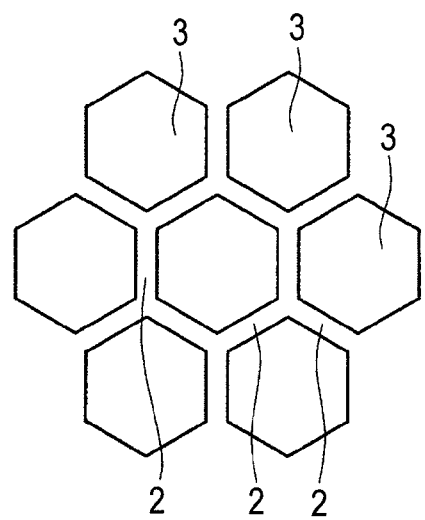
FIG. 8B is a plain layout illustrating a modified example of the semiconductor device of the embodiment 1 of the present invention.
Figure 8C:
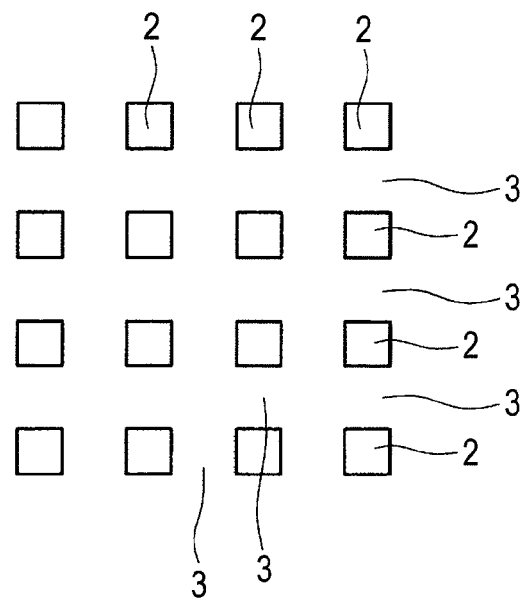
FIG. 8C is a plain layout illustrating a modified example of the semiconductor device of the embodiment 1 of the present invention.

As illustrated in FIG. 1, in this embodiment, a stripe pattern in which the drift layers 2 and the p-type semiconductor regions 3 extending in the first direction are plurally arranged side by side in planar view are illustrated as an example of the structure of the JBS diode. However, arrangement of the drift layer 2 and the p-type semiconductor region 3 is not limited to the stripe pattern and may be an island-like pattern represented by FIG. 8A, a polygonal pattern represented by FIG. 8B, and a lattice pattern represented by FIG. 8C can be applicable. FIGS. 8A to 8C are planar layouts illustrating a modified example of the semiconductor device of this embodiment, and only a part of the drift layers 2 and the p-type semiconductor regions 3 located in the active region are illustrated.

In this embodiment, estimation result in the case of the specific values of the etch pit density $D_{EP}$ and the area of the active region was described as the examples as described above. Through these trial productions, the inventors of the present invention obtain a viewpoint that, when a high yield rate is realized in the semiconductor device including the active region having an area of 0.1 cm² or more and having a large current capacity, the p-type semiconductor region 3 should have wider area than the area of the drift layer 2 (when the drift layers 2 and the multiple p-type semiconductor regions 3 are plurally arranged side by side in a stripe pattern, the stripe pattern having the width P>the width S should be formed).

As a result of calculation, however, following formula 10 is required to be satisfied in order to realize a yield rate of 98% in the semiconductor device providing the active region having an area of 1 cm² or more and having a large current capacity.

$$D_{EP} \times A_S \leq 20.2 \quad (10)$$

A condition satisfying formula 8 and formula 10 is a diagonal line region of FIG. 10. In the semiconductor device satisfying this condition and providing an active region having an area of 1 cm², when a stripe pattern in which the width P and the width S are equal ($A_S$=0.5 cm²) are arranged, formula 10 is transformed into formula 11.

$$D_{EP} \leq 40.4 \quad (11)$$

This means that when the p-type semiconductor region 3 and the drift layer 2 are set to equal size of areas (for example, a stripe pattern in which the width P=the width S is arranged), or the p-type semiconductor region 3 is set to a smaller area than that of the drift layer 2 (for example, a stripe pattern in which the width P>the width S is arranged), both cases result in almost equal yield rates.

Therefore, particularly in the case of use of a semiconductor substrate having an etch pit density $D_{PE}$ satisfying formula 12, a significant technological advantage can be expected by setting the p-type semiconductor region to have a wider area than that of the drift layer 2 (for example, a stripe pattern having the width P>the width S is arranged) in the semiconductor device having a large current capacity and providing an active region having an area of 0.1 cm² or more.

$$D_{EP} > 40.4 \quad (12)$$

Since formula 12 can be further transformed into, $$D_K > 0.00404 \quad (13)$$

to satisfy formula 12 can be restated to satisfy formula 13.

Figure 4:
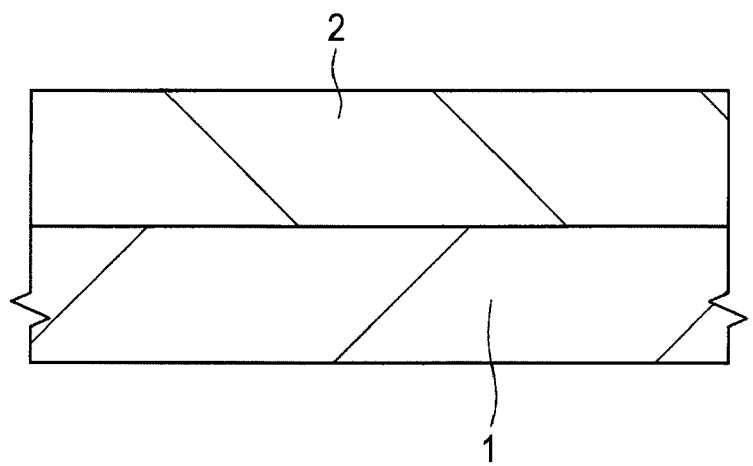
FIG. 4 is a cross-sectional view illustrating a process for manufacturing the semiconductor device of the embodiment 1 of the present invention.
Figure 5:
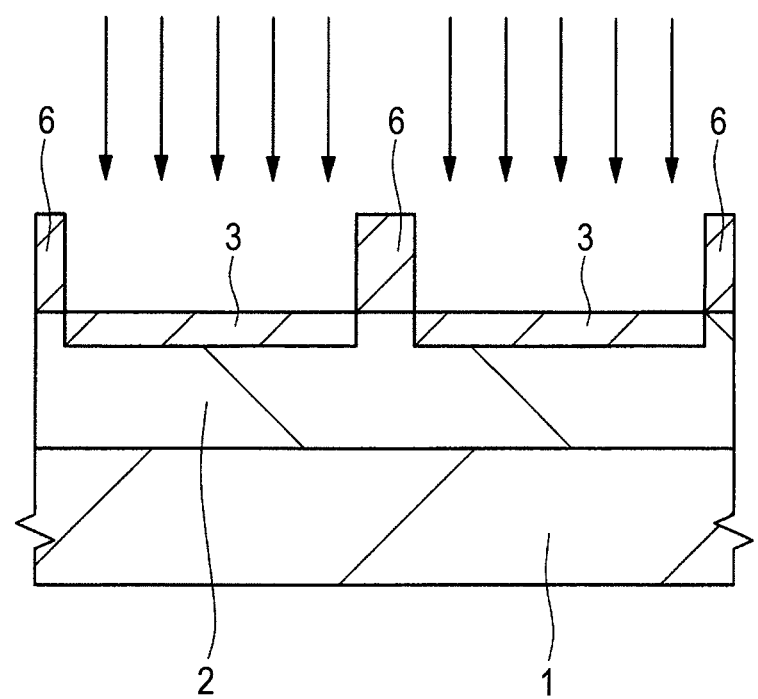
FIG. 5 is a cross-sectional view in the process for manufacturing the semiconductor device subsequent to FIG. 4.
Figure 6:
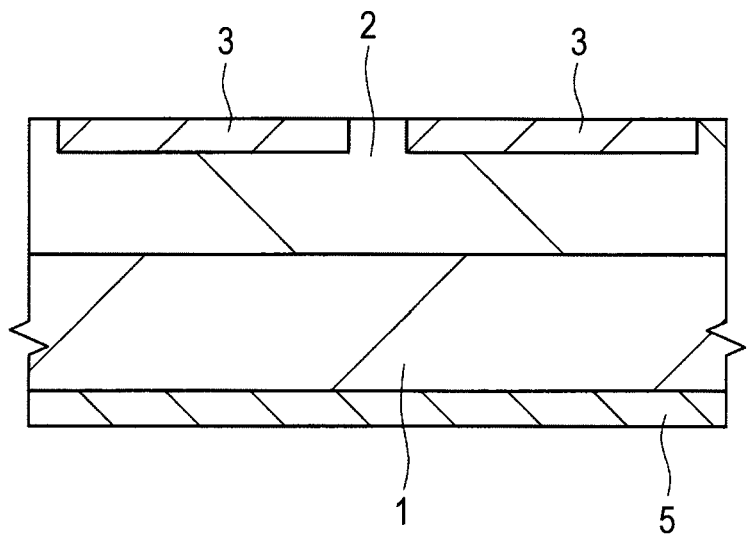
FIG. 6 is a cross-sectional view in the process for manufacturing the semiconductor device subsequent to FIG. 5.

Hereinafter, processes for manufacturing a semiconductor device of this embodiment will be described using FIG. 1 to FIG. 6. FIG. 4 to FIG. 6 are cross-sectional views illustrating the processes for manufacturing the semiconductor device of this embodiment, and illustrate similar position to the cross-sectional view taken from line A-A in FIG. 1.

First, as illustrated in FIG. 4, an SiC substrate on which n⁻-type drift layer 2 containing low impurity concentration is formed on an n⁺-type semiconductor substrate 1 mainly containing SiC (silicon carbide) by using an epitaxial growth method is provided. Both of the semiconductor substrate 1 and the drift layer 2 contain n type impurity (for example, N (nitrogen)), and the semiconductor substrate 1 contains a higher concentration of the n type, impurity (for example, N (nitrogen)) than the concentration contained in the drift layer 2.

An impurity concentration of the semiconductor substrate 1 is about $1 \times 10^{18}$-$1 \times 10^{19}$ cm⁻³. For the main surface of the semiconductor substrate 1, (0001) face, (000-1) face, and (11-20) face may be used. However, any of these main faces of the semiconductor substrate 1 can be selected in this embodiment.

A specification of the drift layer 2 on the semiconductor substrate 1 varies depending on reverse voltage which is set for the JBS diode formed through subsequent processes. In the same conduction type as the semiconductor substrate 1, a concentration range of the impurity contained in the drift layer 2 is about $1 \times 10^{15}$-$4 \times 10^{16}$ cm⁻³ and a thickness of the drift layer 2 is in the range of about 3-80 μm. For example when a reverse voltage of 600 V is assumed, in order to form the drift layer 2 having an impurity concentration of $1 \times 10^{16}$-$2 \times 10^{16}$ cm⁻³ and a thickness of 4-6 μm, a resistance of the JBS diode formed through subsequent processes in the forward direction at the time of power distribution is set to about 1 mΩcm² in addition to the resistance of the semiconductor substrate 1. Consequently, the JBS diode is used in a current density of about 300-500 A/cm².

On the other hand, for example, when a reverse voltage of 3.3 kV is assumed, in order to form the drift layer 2 having an impurity concentration of $2 \times 10^{15}$-$4 \times 10^{15}$ cm⁻³ and a thickness of 20-30 μm, a resistance of the JBS diode formed through subsequent processes in the forward direction at the time of power distribution is set to about 5-10 mΩcm² in addition to the resistance of the semiconductor substrate 1. Consequently, the JBS diode is used in a current density of about 100-150 A/cm².

Subsequently, as illustrated in FIG. 5, an insulating film made of silicon oxide (SiO₂) is formed on the entire surface of the drift layer 2 by using a chemical vapor deposition (CVD) method or the like, and thereafter, the insulating film is patterned by a known lithography technology and a dry etching method to form a mask material layer 6 made of the insulating film. The mask material layer 6 has a stripe pattern in which the mask material layers 6 extend in the first direction and are plurally arranged side by side in the second direction. The mask material layer 6 is processed in a stripe pattern, an island-like pattern, a polygonal pattern, or a lattice pattern. In this embodiment, however, any shape can be used as long as the pattern is formed in a constant width and interval.

Subsequently, a p-type semiconductor region 3 is formed on the upper surface of the drift layer 2 by ion implantation of p-type impurity (for example, Al (aluminum)) on the upper surface of the drift layer 2 exposed from the mask material layer 6. The p-type impurity concentration and the junction depth of the p-type semiconductor region 3 is about $10^{18}$-$10^{20}$ cm⁻³ and about 0.3-2.0 μm, respectively. As the p-type impurity (a dopant), B (boron) and the like may be used other than Al (aluminum). However, Al (aluminum) is used as the dopant in this embodiment. In this ion implantation process, a total dose amount of Al ion of $1.8\times10^{14}$ is implanted in multistep at an acceleration energy of 35-145 keV to form the p-type semiconductor region 3 in such a manner that an impurity concentration close to the surface of the drift layer 2 is about $9\times10^{18}$ and a junction depth is about 0.55-0.7 μm.

Subsequently, although illustration is omitted, removing the mask material layer 6, a guard ring region 8 (refer to FIG. 3) is formed by implanting the p-type impurity (for example, Al (aluminum)) into a region which becomes a circumferential part of a semiconductor chip so as to surround the active region where the p-type semiconductor region 3 is formed in planar view by a similar procedure to the process which forms the p-type semiconductor region 3. The guard ring region 8 is a semiconductor region defining the active region of a JBS diode which will be formed.

Subsequently, as illustrated in FIG. 6, thermal treatment (annealing) for the purpose of activation of the ion-implanted impurity is performed, and thereafter an ohmic electrode 5 which is in ohmically contact with the back surface of the semiconductor substrate 1 is formed by a sputtering method or the like.

Subsequently, a metal film is formed on the drift layer 2 by the sputtering method or the like in such a manner that the metal film is in contact with the upper surface of the drift layer 2 and the upper surface of the p-type semiconductor region 3. Thereafter, the metal film is patterned by the lithography technology and the etching method to form a Schottky electrode 4 made of the metal film. Thus, a main part of the semiconductor device of this embodiment illustrated in FIG. 1 and the FIG. 2 is accomplished.

An insulating film made of $SiO_2$ and the like is formed over the entire surface of the semiconductor substrate 1 for the purpose of surface protection of the semiconductor device and prevention of discharge form the electrode edge, and an opening part 10 exposing the upper surface of the Schottky electrode 4 is formed by patterning a part of the insulating film in the upper part of the active region in order to form the electrode terminal, and thereby an interlayer insulating film 9 (refer to FIG. 3) made of the insulating film is formed. Thus, the semiconductor device of this embodiment is accomplished.

As a method for forming the Schottky electrode 4, a method for processing the Schottky electrode 4 processed so as to terminate the Schottky electrode 4 on the guard ring region (the p-type semiconductor region) 8 as illustrated in FIG. 3 is used On the other hand, as illustrated in FIG. 7, the interlayer insulating film 9a made of the insulating film is formed by processing the insulating film formed on the drift layer 2 using the lithography technology and the dry etching method or a wet etching method, and thereafter, a Schottky electrode 4 which terminates in a region just above the guard ring region 8 and on the interlayer insulating film 9a may be formed.

The guard ring region 8 is a semiconductor region provided so as not to concentrate an electric field at the edge part of the Schottky electrode 4 or at a boundary part between the Schottky electrode 4 and the interlayer insulating film 9 (refer to FIG. 3). In either case of the structure illustrated in FIG. 3 or FIG. 7 described above, the edge part of the Schottky electrode 4 or the boundary part between the Schottky electrode 4 and the interlayer insulating film 9 or 9a (the edge part of the Schottky electrode 4) is located just above the guard ring region 8. In the description of the method for manufacturing described above, a method for separately forming the guard ring region 8 and the p-type semiconductor region 3 is described. However, the guard ring region 8 and the p-type semiconductor region 3 may be formed in the same process.

Only the main part of the JBS diode is described here. However, around the peripheral part of the semiconductor chip, relaxation structures of electric field concentration such as a field limiting ring (FLR) or a junction termination extension (JTE) can be provided so as to surround the active region. A channel stopper provided for the relaxation of electric field concentration or element isolation is formed on the upper surface of the drift layer 2 using the known lithography technology, dry etching method, and ion implantation before activation annealing of implanted impurity is performed.

In this embodiment, $SiO_2$ is applied to a member of the mask material layer 6 (refer to FIG. 5). However, the member of the mask material layer 6 may be, for example, a silicon nitride film or a photoresist film. Any other material can be applied as long as a material acting as a mask at the time of ion implantation is used.

In this embodiment, after the activation annealing for the implanted impurity is performed, subsequently the electrodes are formed on the upper surface and the back surface of the semiconductor substrate 1. However, after the activation annealing for the implanted impurity is performed, a sacrificial oxidation process in which oxidation is performed to remove the damage layer generated in the surface of the drift layer 2 may be performed.

In this embodiment, after the activation annealing for the implanted impurity is performed, subsequently the electrodes are formed on the upper surface and the back surface of the semiconductor substrate 1. However, a surface protection film made of $SiO_2$ and the like may be formed on the surface of the drift layer 2 by the CVD method to protect the surface of the drift layer 2. In this case, after forming the surface protection film the surface protection film is processed so as to open only a region where the Schottky electrode is formed. After performing the sacrificial oxidation process described above, the surface protection film may be formed.

Embodiment 2

In this embodiment, a semiconductor device, similar to the semiconductor device of the embodiment 1, in which an n-type semiconductor region 11 is formed on the upper surface of the drift layer 2 is described.

Figure 11:
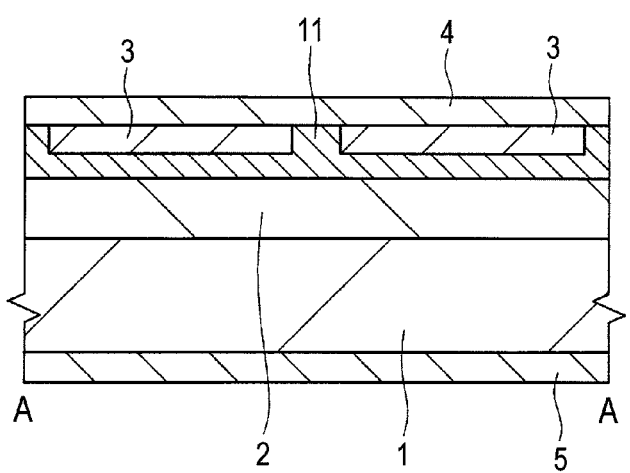
FIG. 11 is a cross-sectional view illustrating a semiconductor device being an embodiment 2 of the present invention.

In FIG. 11, a cross-sectional view of the semiconductor device of this embodiment is illustrated. Although a structure f the semiconductor device illustrated in FIG. 11 is almost equal to the structure of the semiconductor device of the embodiment 1 illustrated in FIG. 2, the structure is different from the structure of the semiconductor device of the embodiment 1 only in that the n-type semiconductor region 11 having a higher impurity concentration than that of the drift layer 2 is formed on the upper surface of the drift layer 2. The n-type semiconductor region 11 is a semiconductor region having a deeper junction depth than that of the p-type semiconductor region 3, and, for example N (nitrogen) is introduced as an impurity. In other words, in the drift layer 2, the side surfaces and the bottom surface of the p-type semiconductor region 3 are covered with the p-type semiconductor region 11, and the p-type semiconductor region 3 is located within the n-type semiconductor region 11.

By existence of the n-type semiconductor region 11, electric current spreads to the lower part of the junction barrier region at the time the operation of the JBS diode. As a result, in addition to the similar effects described in the embodiment 1, an effect of suppressing increase in on-voltage of the JBS diode can be obtained.

Figure 12:
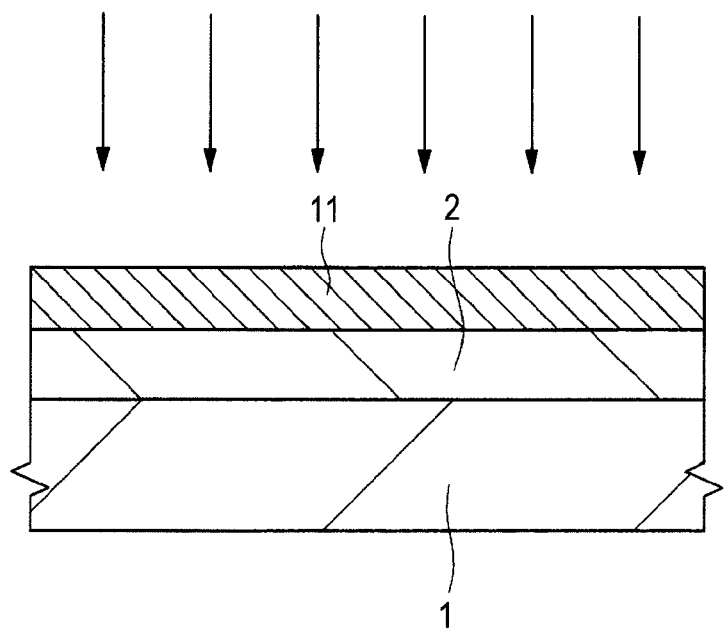
FIG. 12 is a cross-sectional view illustrating a process for manufacturing a semiconductor device of the embodiment 2 of the present invention.

Subsequently, a process of manufacturing of the semiconductor device of this embodiment is described using 12. FIG. 12 is a cross-sectional view manufacturing at a position similar to the cross section taken from line A-A illustrated in FIG. 1.

First, similar to the process described using FIG. 4, a SiC substrate on which the drift layer 2 containing a low impurity concentration is formed on the semiconductor substrate 1 by using the epitaxial growth method is prepared. The semiconductor substrate 1 and the drift layer 2 have a specification of a similar impurity concentration and a thickness to the embodiment 1.

Subsequently, as illustrated in FIG. 12, the n-type semiconductor region 11 is formed on the surface of the drift layer 2 by the ion implantation of the n-type impurity (for example, N (nitrogen)). The impurity concentration of the n-type semiconductor region 11 is applicable relatively higher than that of the drift layer 2. For example, the n-type semiconductor region is formed by multistep implantation in an energy of about 700 keV or less. The ion implantation is performed in order to from the n-type semiconductor region 11 on the entire surface of the drift layer 2. However, the ion implantation may be performed only in the active region by using the lithography technology and the dry etching method (refer FIG. 14).

As processes thereafter, the processes described by using FIG. 5 and FIG. 6 are performed, and thereby the semiconductor device of this embodiment illustrated in FIG. 11 is accomplished. The method for forming the p-type semiconductor region 3 after forming the n-type semiconductor region 11 is described. However, a reverse order of the formation may be applicable.

Figure 13:
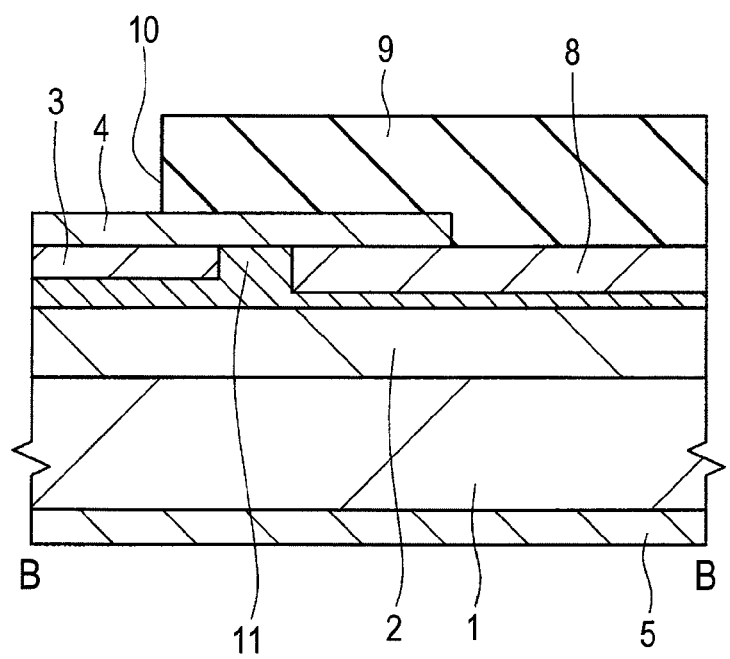
FIG. 13 is a cross-sectional view illustrating a semiconductor device being the embodiment 2 of the present invention.
Figure 14:
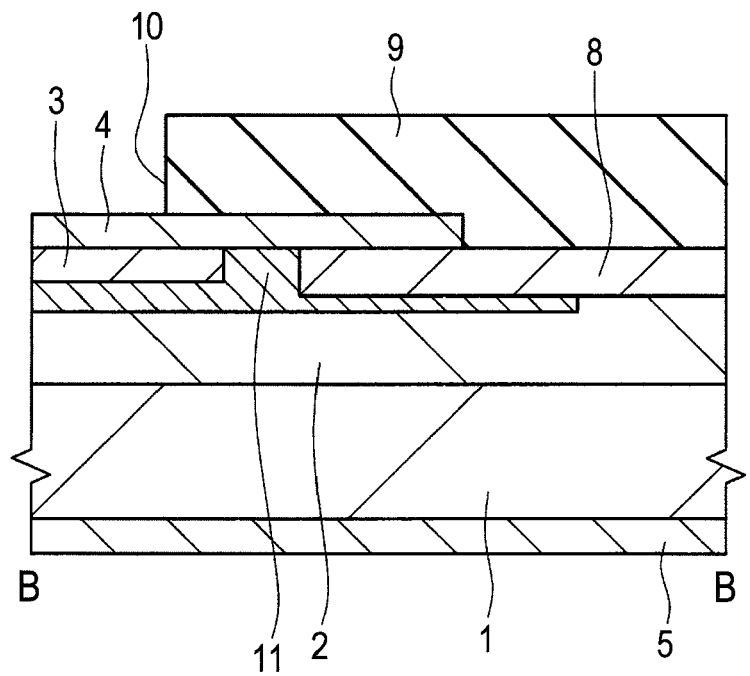
FIG. 14 is a cross-sectional view of a modified example of the semiconductor device of the embodiment 2 of the present invention.

FIG. 13 and FIG. 14 are cross-sectional views illustrating an edge part of the Schottky electrode 4 of this embodiment. FIG. 13 illustrates a structure in which the n-type semiconductor region 11 is formed on the entire surface of the drift layer 2 by performing ion implantation. FIG. 14 is a modified example of the semiconductor device of this embodiment and illustrates a structure in which the n-type semiconductor region 11 is formed only in the active region by performing the ion implantation. In the structure illustrated in FIG. 13, the n-type semiconductor region 11 is formed on the upper surface of the drift layer 2 in addition to the structure described by using FIG. 3. The n-type semiconductor region 11 should have deeper junction depth than those of the p-type semiconductor region 3 and the guard ring region 8.

The structure illustrated in FIG. 14 is similar to the structure illustrated in FIG. 13. However, the structure illustrated in FIG. 14 is different form the structure illustrated in FIG. 13 in that the n-type semiconductor region 11 is not formed outside of the guard ring region 8 defining the active region. In other words, in FIG. 14, the n-type semiconductor region 11 is formed in the active region and the n-type semiconductor region 11 is also formed in a region where the n-type semiconductor region 11 is overlapped with the guard ring region 8 in planar view. However, the n-type semiconductor region 11 is not formed in an outer region (a peripheral part of the semiconductor chip) of the guard ring region 8 having an annular planar shape because the n-type semiconductor region 11 terminates in the region where the n-type semiconductor region 11 is overlapped with the guard ring region 8 in planar view. Briefly, as illustrated in FIG. 14, the n-type semiconductor region 11 terminates just below the guard ring region 8.

The structure illustrated in FIG. 13 has an advantage that the lithography process can be skipped, while the structure illustrated in FIG. 14 has an advantage that design of the terminal structure of the semiconductor chip is not required to be changed with respect to the structure in which the n-type semiconductor region 11 is not formed (refer to FIG. 3). As illustrated in FIG. 7, the mounted structure of the Schottky electrode 4 may be applied to the structures of FIG. 13 or FIG. 14.

Figure 15:
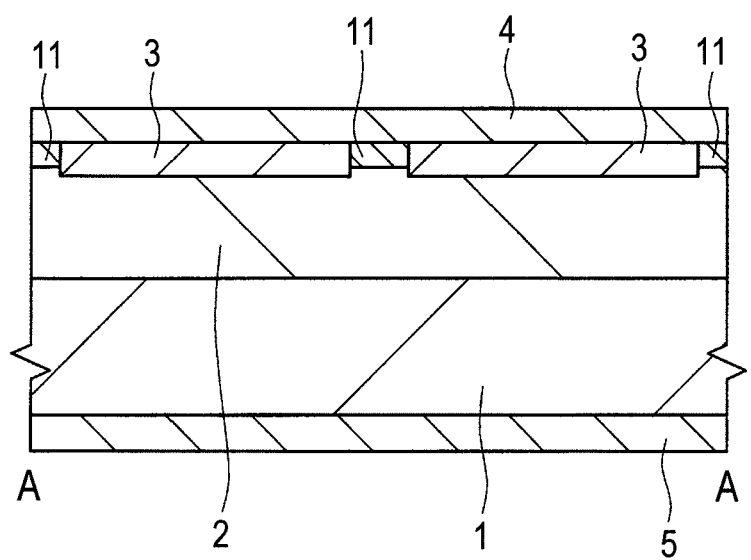
FIG. 15 is a cross-sectional view of a modified example of the semiconductor device of the embodiment 2 of the present invention.

Subsequently, a cross-sectional view of a modified example of the semiconductor device of this embodiment is illustrated in FIG. 15. Different from the structure illustrated in FIG. 11, a structure illustrated in FIG. 15 has shallow depth of the formed n-type semiconductor region 11. Here, it is assumed that the junction depth of the n-type semiconductor region 11 is shallower than that of the p-type semiconductor region 3. In this case, an ion implantation for forming the n-type semiconductor region 11 can be simplified because the n-type semiconductor region 11 can be formed by, for example, multistep implantation of about 400 keV or less.

The semiconductor device of the modified example of this embodiment illustrated in FIG. 15 cannot support electric current spread because the n-type semiconductor region 11 is not formed to a lower part of the p-type semiconductor region 3. However, increase in on-voltage of the JBS diode can be suppressed because intervals between the p-type semiconductor regions 3 adjacent each other in the second direction can be reduced and resistance close to the Schottky interface also can be reduced.

In this embodiment, the n-type semiconductor region 11 is formed by the ion implantation. However, before the p-type semiconductor region 3 is formed, an epitaxial growth film which will be the n-type semiconductor region 11 may further be formed on the surface of the drift layer 2. In this case, a structure of the edge of the Schottky electrode is the structure illustrated in FIG. 13.

As described above, the inventions achieved by the inventors of the present invention is described based on the embodiments. However, it goes without saying that the present invention is not limited to the embodiments, and various modifications can be made without departing from the scope o the present invention.

For example, as a matter of convenience for the description of the embodiments, only examples which use the n-type semiconductor substrate are described. However, p-type semiconductor substrate also may be used. In this case, in the semiconductor device and the method for manufacturing the same described above, the conduction type described as the n-type may be replaced to the p-type and the conduction type described as the p-type may be replaced to the n-type at the same time.

What is claimed is:

1. A semiconductor device comprising a Schottky barrier diode, the Schottky barrier diode comprising:
   a semiconductor substrate having a first conduction type and containing silicon carbide;
   a first semiconductor region formed on the semiconductor substrate and having the first conduction type;
   an active region having an area of 0.1 cm$^2$ or more in the main surface of the first semiconductor region;
   a plurality of second semiconductor regions formed on the upper surface of the first semiconductor region in the active region and having a second conduction type opposite to the first conduction type;
   a first electrode connected by Schottky connection to the first semiconductor region in the active region; and
   a second electrode electrically connected to a back surface of the semiconductor substrate,
   wherein a multiplication of a density of defects $D_{EP}$ which the first semiconductor region has and an area of the first semiconductor region $A_S$ exposed from the second semiconductor regions in the active region satisfies $D_{EP} \times A_S \leq 223$.

2. The semiconductor device according to claim 1, wherein the second semiconductor region, is wider than the first semiconductor region.

3. The semiconductor device according to claim 2, wherein the density of defects $D_{EP}$ satisfies $D_{EP} > 40.4$.

4. The semiconductor device according to claim 1, wherein the multiplication of the density $D_{EP}$ and the area $A_S$ satisfies $D_{EP} \times A_S \leq 105$.

5. The semiconductor device according to claim 1, wherein a third semiconductor region having the first conduction type is formed on the upper surface of the first semiconductor region, and
the third semiconductor region has a higher impurity concentration than that of the first semiconductor region.

6. The semiconductor device according to claim 5, wherein the second semiconductor regions are formed inside of the third semiconductor region.

7. The semiconductor device according to claim 5, wherein the third semiconductor region is formed only in the active region.

8. The semiconductor device according to claim 5, wherein the third semiconductor region has a shallower junction depth than that of the second semiconductor region.

9. The semiconductor device according to claim 1, wherein, in planar view,
each of the first semiconductor region and the second semiconductor region in the active region extends in a first direction along the main surface of the semiconductor substrate;
the first semiconductor region and the second semiconductor region are plurally formed side by side in a second direction; and
the first semiconductor region and the second semiconductor regions are alternately arranged side by side in a second direction.

10. The semiconductor device according to claim 1, wherein a fourth semiconductor region having the second conduction type is formed on the upper surface of the first semiconductor region so as to surround the active region; and
the fourth semiconductor region defines the active region.

* * * * *